(12) United States Patent
Eichler et al.

(10) Patent No.: US 8,022,392 B2
(45) Date of Patent: Sep. 20, 2011

(54) SEMICONDUCTOR LAYER STRUCTURE WITH SUPERLATTICE

(75) Inventors: Christoph Eichler, Tegernheim (DE); Alfred Lell, Maxhuette-Haidhof (DE); Andreas Miler, Kaufering (DE); Marc Schillgalies, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 815 days.

(21) Appl. No.: 11/780,516

(22) Filed: Jul. 20, 2007

(65) Prior Publication Data

US 2008/0054252 A1    Mar. 6, 2008

(30) Foreign Application Priority Data

Jul. 27, 2006   (DE) .................. 10 2006 034 822
Sep. 29, 2006   (DE) .................. 10 2006 046 228

(51) Int. Cl.
*H01L 29/06* (2006.01)

(52) U.S. Cl. .................. 257/22; 257/103; 257/E29.005; 257/E29.078; 257/E33.008

(58) Field of Classification Search .................... 257/22, 257/E29.005, E29.078, E33.008, 103
See application file for complete search history.

(56) References Cited

U.S. PATENT DOCUMENTS

| | | |
|---|---|---|
| 4,839,899 A | 6/1989 | Burnham et al. |
| 4,882,734 A | 11/1989 | Scifres et al. |
| 4,984,242 A | 1/1991 | Scifres et al. |
| 5,027,164 A | 6/1991 | Awano |
| 5,128,728 A | 7/1992 | Liu |
| 5,198,682 A | 3/1993 | Wu et al. |
| 5,319,657 A | 6/1994 | Otsuka et al. |
| 5,395,793 A | 3/1995 | Charbonneau et al. |
| 5,497,012 A | 3/1996 | Moll |
| 5,570,386 A | 10/1996 | Capasso et al. |
| 5,588,015 A | 12/1996 | Yang |
| 5,936,989 A | 8/1999 | Capasso et al. |
| 6,046,464 A | 4/2000 | Schetzina |
| 6,172,382 B1 | 1/2001 | Nagahama et al. |

(Continued)

FOREIGN PATENT DOCUMENTS

DE          102 13 395        10/2002

(Continued)

OTHER PUBLICATIONS

T. Asano et al., "High-power 400-nm-band AlGaInN-based laser diodes with low aspect ratio", *Applied Physics Letters*, vol. 80, No. 19, pp. 3497-3499 (May 13, 2002).

(Continued)

*Primary Examiner* — Hung Vu
*Assistant Examiner* — Vernon P Webb
(74) *Attorney, Agent, or Firm* — Fish & Richardson P.C.

(57) ABSTRACT

The semiconductor layer structure includes an active layer and a superlattice composed of stacked layers of III-V compound semiconductors of a first and at least one second type. Adjacent layers of different types in the superlattice differ in composition with respect to at least one element. The layers have predefined layer thicknesses, such that the layer thicknesses of layers of the first type and of the layers of the second type increase from layer to layer with increasing distance from an active layer. An increasing layer thickness within the layers of the first and the second type is suitable for adapting the electrical, optical and epitaxial properties of the superlattice to given requirements in the best possible manner.

12 Claims, 2 Drawing Sheets

U.S. PATENT DOCUMENTS

| | | |
|---|---|---|
| 6,175,123 B1 | 1/2001 | Kano |
| 6,455,870 B1 | 9/2002 | Wang et al. ............ 257/750 |
| 6,489,636 B1 | 12/2002 | Goetz et al. |
| 6,541,798 B2 | 4/2003 | Koike et al. |
| 6,617,061 B2 | 9/2003 | Koike et al. |
| 6,649,942 B2 | 11/2003 | Hata et al. |
| 6,849,864 B2 | 2/2005 | Nagahama et al. |
| 6,849,881 B1 | 2/2005 | Harle et al. |
| 7,106,090 B2 | 9/2006 | Harle et al. |
| 7,556,974 B2 | 7/2009 | Harle et al. |
| 7,609,737 B2 | 10/2009 | Matsumura et al. |
| 2001/0028668 A1 | 10/2001 | Fukunaga et al. |
| 2002/0008245 A1 | 1/2002 | Goetz et al. |
| 2002/0190259 A1 | 12/2002 | Goetz et al. |
| 2002/0190263 A1 | 12/2002 | Hata et al. |
| 2003/0010993 A1 | 1/2003 | Nakamura et al. .......... 257/99 |
| 2003/0042479 A1 | 3/2003 | Tsuchiya |
| 2003/0118066 A1 | 6/2003 | Bour et al. |
| 2003/0178633 A1 | 9/2003 | Flynn et al. |
| 2003/0197188 A1 | 10/2003 | Watatani et al. |
| 2003/0235224 A1 | 12/2003 | Ohlander |
| 2004/0051107 A1 | 3/2004 | Nagahama et al. |
| 2004/0208213 A1 | 10/2004 | Lichtenstein et al. |
| 2005/0029506 A1 | 2/2005 | Lee et al. |
| 2005/0045895 A1 | 3/2005 | Emerson et al. |
| 2005/0051861 A1 | 3/2005 | Shi et al. |
| 2005/0056824 A1 | 3/2005 | Bergmann et al. .......... 257/14 |
| 2005/0116216 A1 | 6/2005 | Harle et al. |
| 2005/0142682 A1 | 6/2005 | Ishibashi et al. |
| 2005/0151255 A1 | 7/2005 | Ando et al. ............ 257/750 |
| 2005/0213627 A1 | 9/2005 | Masselink et al. |
| 2006/0011938 A1 | 1/2006 | Debray et al. ............ 257/14 |
| 2006/0256825 A1* | 11/2006 | Matsumura et al. ....... 372/43.01 |
| 2006/0289854 A1 | 12/2006 | Harle et al. |
| 2008/0025360 A1 | 1/2008 | Eichler et al. |
| 2008/0049801 A1 | 2/2008 | Eichler et al. |
| 2008/0054247 A1 | 3/2008 | Eichler et al. |

FOREIGN PATENT DOCUMENTS

| | | |
|---|---|---|
| EP | 0 358 842 | 3/1990 |
| EP | 0 378 919 | 7/1990 |
| EP | 0874403 | 10/1998 |
| EP | 0 881 666 | 12/1998 |
| EP | 1 018 770 | 7/2000 |
| EP | 1 215 781 | 6/2002 |
| EP | 1 220 304 | 7/2002 |
| EP | 1 670 106 | 6/2006 |
| EP | 1 883 140 | 1/2008 |
| EP | 1 883 141 | 1/2008 |
| GB | 2 396 054 | 6/2004 |
| JP | 60-145686 | 8/1985 |
| JP | 10-22524 | 1/1998 |
| JP | 11-251684 | 9/1999 |
| JP | 2000-91708 | 3/2000 |
| JP | 2000-244070 | 9/2000 |
| JP | 2008-034851 | 2/2008 |
| JP | 2008-034852 | 2/2008 |
| WO | WO 00/58999 | 10/2000 |
| WO | WO 2004/084366 | 10/2004 |
| WO | WO 2006/068376 | 6/2006 |

OTHER PUBLICATIONS

M.Z. Kauser et al., "Enhanced vertical transport in p-type AlGaN/GaN superlattices", *Applied Physics Letters*, vol. 85, No. 22, pp. 5275-5277 (Nov. 29, 2004).

M.Z. Kauser et al., "Optimization of conductivity in p-type GaN/InGaN-graded superlattices", *Journal of Applied Physics*, vol. 97, pp. 083715-1-083715-5 (2005).

Peter Kozodoy et al., "Enhanced Mg doping efficiency in $Al_{0.2}Ga_{0.8}N$/GaN superlattices", *Applied Physics Letters*, vol. 74, No. 24, pp. 3681-3683 (Jun. 14, 1999).

Peter Kozodoy et al., "Polarization-enhanced Mg doping of AlGaN/GaN superlattices", *Applied Physics Letters*, vol. 75, No. 16, pp. 2444-2446 (Oct. 18, 1999).

Kazuhide Kumakura et al., "Increased Electrical Activity of Mg-Acceptors in $Al_xGa_{1-x}N$/GaN Superlattices", *Jpn. J. Appl. Phys.*, vol. 38, pp. L1012-L1014 (1999).

M. Kuramoto et al., "Reduction of Internal Loss and Threshold Current in a Laser Diode with a Ridge by Selective Re-Growth (RiS-LD)", *Phys. stat. sol.*, vol. 192, No. 2, pp. 329-334 (2002).

K.A. Mikhoyan et al., "Formation of a quasi-two-dimensional electron gas in $GaN/Al_xGa_{1-x}N$ heterostructures with diffuse interfaces", *Journal of Applied Physics*, vol. 95, No. 4, pp. 1843-1848 (Feb. 15, 2004).

Guido Steude et al., "Strain Modification of GaN in AlGaN/GaN Epitaxial Films", *Jpn. J. Appl. Phys.*, vol. 38, pp. L498-L500 (1999).

European Search Report for Application Serial No. 07013822.7-2222 dated Oct. 24, 2007.

S. Nakamura et al., "Present status of InaN/GaN/AlGaN-based laser diodes", *Journal of Crystal Growth*, North Holland Publishing Amsterdam, NL, vol. 189-190 (Jun. 15, 1998).

Ting Gang Zhu et al., "AiGaN-GaN UV Light-Emitting Diodes Grown on SIC by Metal-Organic Chemical Vapor Deposition", *IEEE Journal of Selected Topics in Quantum Electronics*, IEEE Service Center, Piscataway, NJ, vol. 8, No. 2 (Mar. 2002).

EP search report, dated Oct. 21, 2008.

European Search Report for Application No. 07013821.9-2222 dated Nov. 12, 2007.

* cited by examiner

SEMICONDUCTOR LAYER STRUCTURE WITH SUPERLATTICE

CROSS REFERENCE TO RELATED APPLICATIONS

This application claims the benefit of foreign priority applications filed in Germany, serial number 10 2006 034 822.2, filed Jul. 27, 2006, and serial number 10 2006 046 228.9, filed Sep. 29, 2006. The contents of the prior applications are hereby incorporated by reference in their entirety.

BACKGROUND

The invention relates to a semiconductor layer structure comprising an active layer and a superlattice composed of stacked layers of a first and at least one second type, wherein the layers of the first type and of the at least one second type are III-V compound semiconductors, adjacent layers of different types in the superlattice differ in composition with respect to at least one element and the layers have predefined layer thicknesses. The invention further relates to an optoelectronic component comprising such a semiconductor layer structure.

SUMMARY

Superlattices containing stacked layers of different types have different electrical, optical and epitaxial properties from a layer of the same thickness that is composed of just one material of one composition. In particular, with a suitable composition and doping, a superlattice composed of alternately stacked p-doped gallium nitride (GaN) and p-doped aluminum gallium nitride (AlGaN) layers may have a higher conductivity than a p-doped pure GaN or AlGaN layer of the same thickness. Due to these properties, superlattices have found numerous applications in electronic and optoelectronic components.

It is an object of the invention to create a semiconductor layer structure with superlattice of the initially cited kind that has improved electrical and optical properties. It is a further object of the invention to specify an optoelectronic component having such a semiconductor layer structure.

This object is achieved in accordance with Claim 1 by means of a semiconductor layer structure of the initially cited kind in which the layer thicknesses of the layers of the first type and of the layers of the second type increase from layer to layer with increasing distance from the active layer.

The thickness of the layers of a superlattice influences its electrical, optical and epitaxial properties. Requirements on the superlattice frequently are not the same over its entire thickness, for example because physical variables, such as electrical or optical field strength, that influence those requirements also are not constant over the thickness of the superlattice. A superlattice in which the layer thickness in layers of a first and a second type increases from layer to layer with increasing distance from the active layer makes it possible to accommodate this fact and to adapt the properties of the superlattice to given requirements, particularly spatially varying requirements, in the best possible manner.

For example, the thickness of the layers of a superlattice can have an effect on electrical conductivity, the level of optical absorption, the size of the band gap and thermal conductivity. The dependence of such variables on the values of the layer thickness may, however, work against the desired properties of the superlattice. For example, thin layers in the superlattice advantageously result in lower absorption, due to increases in the band gap caused by quantization effects, but also to lower thermal conduction in the vertical direction, because of the larger number of boundary layers in the superlattice, and to lower lateral electrical conductivity.

In such a case, having all the layers in the superlattice be of the same thickness can, at best, represent a compromise between the advantages that can be gained and the disadvantages that must be accepted. Conversely, layer thicknesses that vary within the superlattice make it possible to accommodate spatially different requirements on the superlattice. For example, to reduce optical absorption losses, layers that are next to a radiation-generating layer of the semiconductor layer structure are preferably implemented in a smaller thickness than more distant layers, which therefore have a higher lateral conductivity, which advantageously increases the lateral uniformity of current flow.

The term "superlattice" basically denotes a structure that exhibits a periodicity in which the period length is greater than the lattice constants of the materials used. In the context of the application, the term "superlattice" is applied to a sequence of stacked layers in which a layer sequence that includes at least two layers of different types repeats in a direction perpendicular to the interfaces between the layers, i.e., for example, in the growth direction of the layers. A superlattice in this sense is constituted, for example, by a sequence of alternately stacked layers of different types, where "alternately" is to be understood as meaning that two or more layers succeed one another by turns. A type can be represented by more than one layer in such a repeating layer sequence. Examples of such superlattices are provided by the following layer sequences: "ab|ab|ab| . . . ", "abc|abc|abc| . . . ", abcb|abcb| . . . " and "abababbc|abababbc| . . . ", where a, b and c each represent layers of a respective type and the repeating layer sequence is indicated by the separator "|".

In the context of the application, the composition of a layer is defined by elements contained in the layer and by its nominal stoichiometry (i.e., the stoichiometry within the accuracy limits of composition monitoring during or after the growth process), dopants and impurities excluded. The stoichiometry is given by the content (percentage) of individual elements in the layer. In the context of the invention, there is no limit on the number of elements in a layer. The layers of the superlattice can, for example, be elementary, i.e. composed of only one element, or they can be binary, ternary, quaternary, etc.

The type of a layer is determined by the composition of that layer, although this does not necessarily mean that all layers of one type have the same composition. The composition of the layers of one type can vary within the superlattice in a predetermined manner, e.g. in that the concentration of one element in the layers of one type increases from layer to layer of that type. Adjacent layers of different types in the superlattice differ in composition with respect to at least one element, however.

According to advantageous configurations of the semiconductor layer structure, the superlattice comprises alternately stacked $In_xAl_yGa_{1-x-y}N$ and $In_wAl_zGa_{1-w-z}N$ layers, where $0 \leq x,y,w,z \leq 1$ and $x+y \leq 1$ and $w+z \leq 1$, or alternately stacked $In_xAl_yGa_{1-x-y}P$ and $In_wAl_zGa_{1-w-z}P$ layers, where $0 \leq x,y,w,z \leq 1$ and $x+y \leq 1$ and $w+z \leq 1$, or alternately stacked $In_xAl_yGa_{1-x-y}As$ and $In_wAl_zGa_{1-w-z}As$ layers, where $0 \leq x,y,w,z \leq 1$ and $x+y \leq 1$ and $w+z \leq 1$. For one thing, these material systems are very important technologically, and for another, an advantageous increase in conductivity, particularly of hole conduction, can be observed in these systems with the use of a superlattice.

According to a further advantageous configuration of the semiconductor layer structure, the individual layers of the superlattice are each assigned a vertical position within the semiconductor layer structure and the thickness of a layer depends in a predetermined manner on the vertical position of that layer in the semiconductor layer structure. In this way, the superlattice and its properties can be adapted in the best possible manner to spatially different requirements on the superlattice.

According to further advantageous configurations, the dependence of the layer thickness of a layer on vertical position either is defined by a common function for all the layers or is defined by a first function for layers of the first type and by at least one second function for layers of the at least one second type. Particularly preferably, the first and/or the at least one second and/or the common function is a step function or a monotonously rising/falling function or a linear function or a polynomial function or a root function or an exponential function or a logarithmic function or a periodic function or a superposition of the aforesaid functions or contains fractions of one of these functions.

According to a further advantageous configuration, at least the layers of a same type within the superlattice have different compositions. The electrical, optical and epitaxial properties of the superlattice can thus be adapted to given requirements in the best possible manner.

In a particularly advantageous configuration, both the layer thicknesses of the layers of the first and second types and the content of a material component in at least the layers of a same type increase from layer to layer with increasing distance from the active layer. Continuous varying the layer thicknesses enables the properties of the superlattice to be adapted in the best possible manner to spatially different requirements on the superlattice, e.g. with respect to its optical absorption, its lateral or vertical electrical conductivity or its thermal conductivity. Advantageous effects can be further strengthened by combining this variation of layer thickness with variation of the material composition, which can also have an impact on the aforesaid properties.

The object is further achieved by means of an optoelectronic component comprising a semiconductor layer structure of the before-described kind. In optoelectronic components, requirements concerning specific properties of the superlattice often are not spatially constant. By means of a semiconductor layer structure in which layers of the same type within the superlattice do not have the same composition, the electrical, optical and epitaxial properties of the superlattice can be adapted in the best possible manner to given requirements.

According to further advantageous configurations, the optoelectronic component is a light-emitting diode or a laser diode.

Further advantageous configurations of the invention will become apparent from the exemplary embodiments described hereinafter in conjunction with the figures.

BRIEF DESCRIPTION OF THE DRAWINGS

Therein.

DETAILED DESCRIPTION

Figure 1:
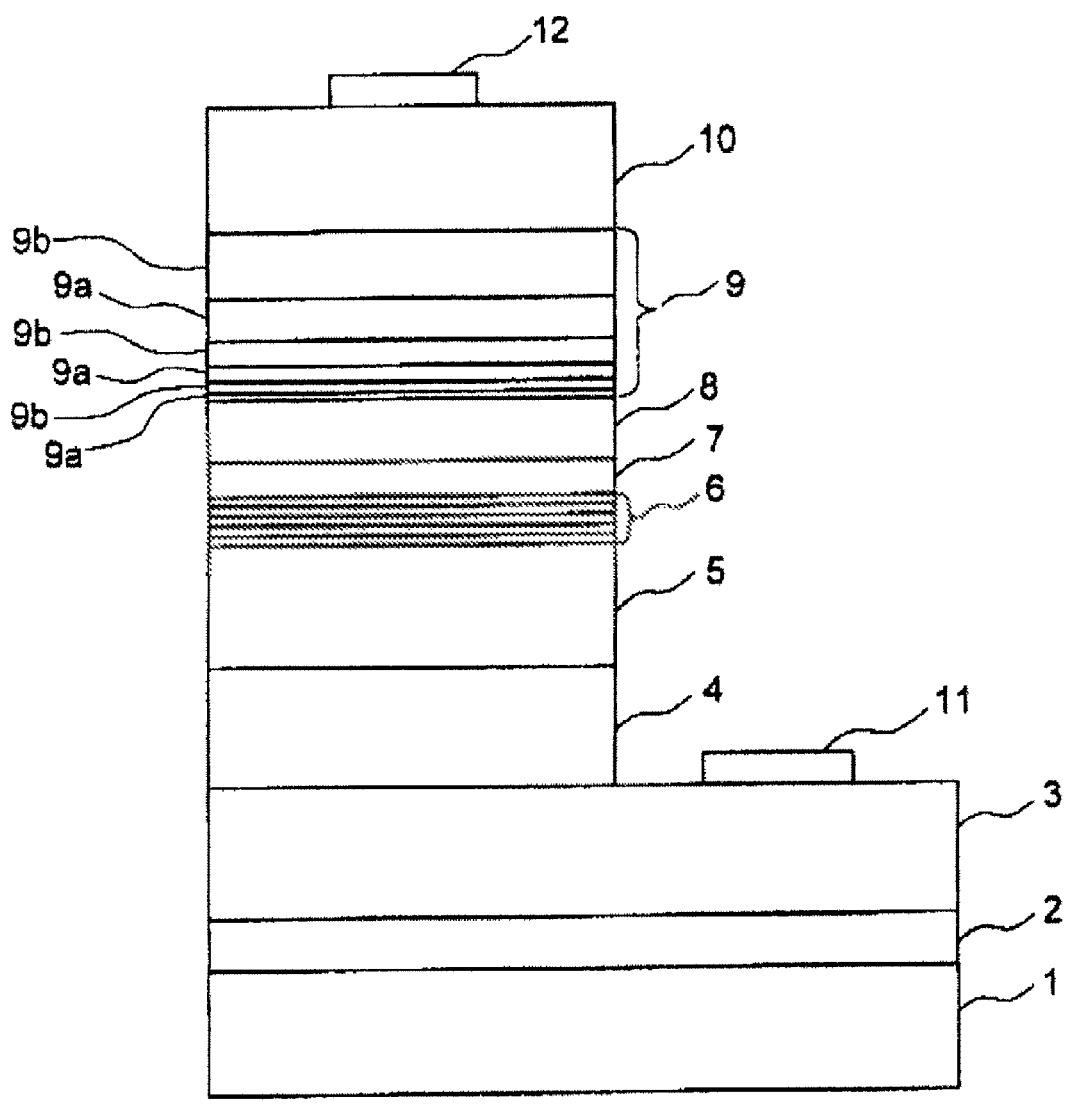
FIG. 1 is a cross-sectional drawing of an optoelectronic component comprising an inventive semiconductor layer structure with superlattice, and FIG. 2 provides schematic representations of the content of an element as a function of vertical position in a superlattice in two different exemplary embodiments of a superlattice of a semiconductor layer structure.

FIG. 1 provides a schematic illustration in cross section of the layer sequence of a semiconductor layer structure of an optoelectronic component with a superlattice. Grown on a substrate 1 is a matching layer 2, followed by an n-doped contact layer 3. To simplify description, the type of doping used in the layers will be specified below by adding the letter n or p as a prefix, i.e., for example, n-contact layer 3.

Disposed on the n-contact layer 3 are an n-cladding layer 4 and an n-waveguide layer 5. Applied to these is an active layer 6, followed by a barrier layer 7 and a p-waveguide layer 8. These are followed by a p-cladding layer implemented as a superlattice 9. The superlattice 9 contains the alternately stacked layers 9a of a first type a and layers 9b of a second type b.

Grown on the superlattice 9 is a p-contact layer 10. In the region on the right, the layer sequence is ablated by etching down to a surface of n-contact layer 3 facing away from the substrate, or masking was used to prevent this region from being built up at all. An n-contact 11 is applied to the exposed area of n-contact layer 3. A p-contact 12 is disposed on p-contact layer 10.

FIG. 1 is to be understood as a schematic drawing. In particular, the illustrated layer thicknesses are not true to scale.

The illustrated exemplary embodiment can be implemented, for example, on the basis of $In_xAl_yGa_{1-x-y}N$, $In_xAl_yGa_{1-x-y}As$, $In_xAl_yGa_{1-x-y}P$ or $In_xGa_{1-x}As_yN_{1-y}$ material systems in which $0 \leq x \leq 1$, $0 \leq y \leq 1$, $0 \leq x+y \leq 1$. The invention naturally is not limited to these material systems, but can also be constructed on the basis of other material systems, depending on the desired wavelength or other requirements.

The component illustrated in FIG. 1 represents a double heterostructure laser diode. Implementation with the $In_xAl_yGa_{1-x-y}N$ material system is described in more detail below by way of example. In such a case, sapphire can be used as the substrate 1 and n-doped GaN as the n-contact layer 3. Silicon (Si) is preferably used to n-dope the GaN layer. An aluminum nitride (AlN) layer is typically provided as a matching layer 2 between the sapphire substrate 1 and the GaN n-contact layer 3 to match the different lattice constants of this layer [sic].

Analogously, the p-contact layer 10 can be implemented in the form of a GaN layer p-doped with magnesium (Mg), in which case hole conduction induced by the magnesium impurities is activated in a known manner, e.g. by electron irradiation or heat treatment, after the growth of the layer. As the n- or p-contacts respectively 11 and 12, electrodes, made for example of aluminum or nickel, can be vapor-deposited on the corresponding n- or p-contact layers respectively 3 and 10. The necessary exposure of the n-contact layer 3 can be effected, for example, by means of a dry etch process in chlorine gas or by argon ion sputtering.

Alternatively, a conductive substrate such as, for example, gallium nitride (GaN) or silicon carbide (SiC) can be used instead of a nonconductive substrate 1. Under these circumstances, it may be possible to dispense with the n-contact layer 3 and, in some cases, e.g. if GaN is used, with the matching layer 2. The n-contact 11 can then be applied opposite the p-contact 12 on the side of the substrate facing away from the semiconductor layer structure, so that a vertically conductive semiconductor layer structure is formed.

Without limitation, FIG. 1 depicts an exemplary embodiment in which n-doped layers are applied to the substrate 1 first. An arrangement in which p-doped layers are arranged closer to the substrate 1 than the n-doped layers is also feasible. The two embodiments may have different properties in terms of charge carrier injection into the semiconductor layer structure. Either embodiment may prove advantageous in the individual case, depending on the desired properties.

The active layer 6 can be, for example, a single or multiple quantum layer structure, in which indium gallium nitride (InGaN) quantum layers are stacked alternately with AlGaN barrier layers.

In the context of the invention, the term "quantum layer" is to be understood as a layer dimensioned or structured such that a quantization of the charge carrier energy level that is essential for the production of radiation occurs, for example by confinement. In particular, the term "quantum layer" carries no implication or restriction as to the dimensionality of the quantization. The quantum layer can form a two-dimensional quantum well or contain structural elements of lower dimensionality, such as quantum wires or quantum dots or combinations of these structures.

In addition, it may also be contemplated to use a photoluminescence-active layer, e.g. a foreign-atom-doped InGaN layer, as active layer 6.

The layers surrounding the active layer 6 (n- and p-waveguide layers respectively 5 and 8, n-cladding layer 4, superlattice 9 as a p-cladding layer, and barrier layer 7) have a larger band gap than the active layer 6. This causes a concentration or confinement of charge carriers on the active layer 6. The number of layers provided for this purpose is not fixed at the number shown in the figure (i.e., five layers), but is in principle arbitrary.

Furthermore, the layers surrounding the active layer 6 form a waveguide for the radiation generated in the active layer 6. Good waveguiding properties are obtained if the refractive index decreases away from the active layer 6 in a direction perpendicular thereto. Since GaN has a higher refractive index than AlGaN, the n- and p-waveguide layers respectively 5 and 8 that are disposed closer to the active layer 6 are implemented as GaN layers in the exemplary embodiment. n-cladding layer 4 and superlattice 9 as a p-cladding layer preferably contain aluminum.

On the side of active layer 6 facing toward the substrate 1 (i.e., the n-doped side), the waveguide layer 5 can therefore be implemented, for example, as an Si-doped GaN layer and the cladding layer 4, correspondingly, as an Si-doped AlGaN layer. On the side of active layer 6 facing away from the substrate 1 (i.e., the p-doped side), analogously, a magnesium (Mg) doped GaN layer can be used as waveguide layer 8. To prevent the direct recombination of electrons diffusing out of the active layer 6 into the waveguide layer 8 with the holes that are present there, barrier layer 7 is additionally provided between the two layers. This can be implemented in the form of an AlGaN layer, which is typically fashioned as much thinner than n- and p-waveguide layers respectively 5 and 8, n-cladding layer 4 or superlattice 9.

The p-side cladding layer is constituted by superlattice 9.

In the exemplary embodiment of FIG. 1, the superlattice 9 is formed by alternately arranged layers 9a of first type a and layers 9b of second type b. By way of example and for greater clarity of illustration, only three layers of each of the two different types a and b are illustrated in the figure. In actual reductions to practice of the invention, the superlattice usually has a larger number of layers, for example several tens of to a few hundred layers of any composition. Typical layer thicknesses for an individual layer of the superlattice 9 are in the range of a few nm to several tens of nm.

The layer thicknesses both of layers 9a of first type a and of layers 9b of second type b are not constant within the superlattice 9, but increase from layer to layer with increasing distance from the active layer 6. Detailed descriptions of superlattices in which the layer thickness varies within the layers of at least one type are provided in connection with the exemplary embodiments of FIG. 2.

In the GaN-based material system, the superlattice 9, as a p-cladding layer, can be composed for example of alternating M-doped GaN layers and Mg-doped AlGaN layers. Due to the high activation energy of the Mg doping atoms, the electrical conductivity of p-doped layers is low. In addition, AlGaN has a larger band gap than GaN and, due to its lower doping efficiency, a lower conductivity. The doping efficiency specifies the concentration in which dopants are actually incorporated by the material and what fraction of the incorporated dopant atoms theoretically (i.e. ignoring temperature-induced filling effects) are actually able to contribute to conductivity. Doping efficiency depends, among other things, on which lattice sites or interlattice sites the doping atoms occupy.

Through the use of more highly and more efficiently dopable, and therefore more conductive, GaN layers, the superlattice 9 can, with an effectively equal refractive index, have a higher conductivity than a p-doped pure AlGaN cladding layer. An effectively equal refractive index can be obtained by having the aluminum content of the AlGaN layers used in the superlattice 9 be higher than that of the pure AlGaN cladding layer.

Instead of a GaN/AlGaN superlattice 9, a superlattice 9 is also conceivable in which $Al_xGa_{1-x}N/Al_yGa_{1-y}N$ layers, where $0 \leq x, y \leq 1$ and $x \neq y$, are alternately stacked. It is further conceivable to use a superlattice for the n-doped AlGaN cladding layer 4. Given the generally higher conductivity of n-doped layers, the advantage in this case does not lie primarily in higher vertical conductivity. However, advantages are to be gained from a potential reduction of the strains induced in the active layer 6. A further advantage, which is relevant particularly in the case of lateral current injection, derives from the increased lateral electrical conductivity of a superlattice.

Figure 2A:
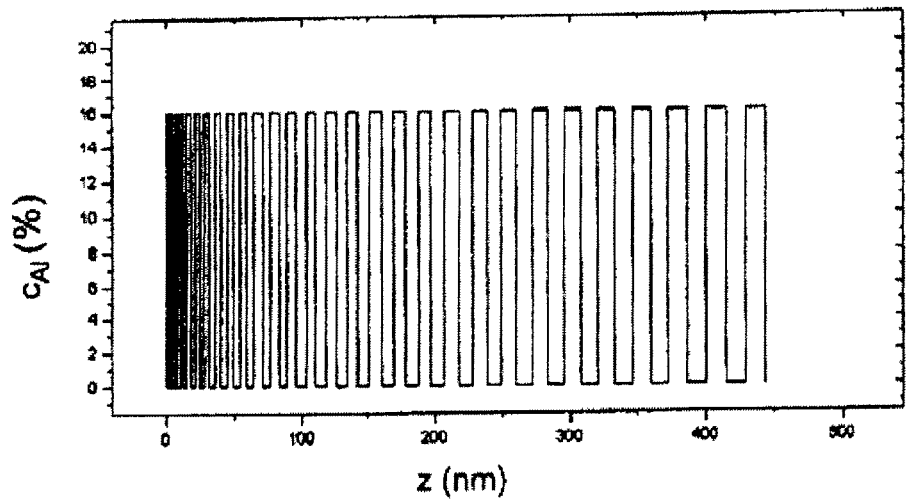
Figure 2B:
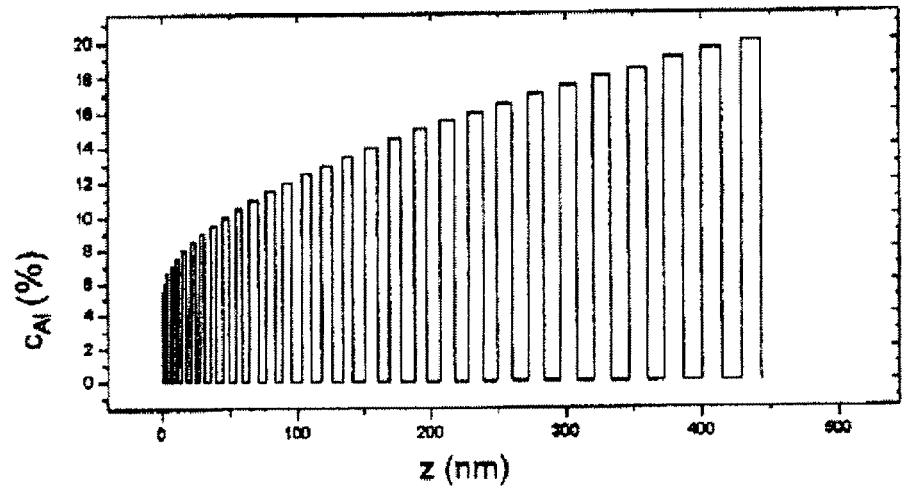

FIG. 2 illustrates two exemplary embodiments of a superlattice containing alternately stacked layers of a first type a and a second type b. The layers of type a are GaN layers, all of which have the same composition. The layers of type b are AlGaN layers that have the same composition in the first case (FIG. 2a) and different compositions in the second (FIG. 2b).

The superlattice is characterized in each case by a graph in which the Al content $c_{Al}$, in percent (ordinate), is plotted against a vertical position z within the superlattice of a semiconductor layer structure (abscissa). The side of the superlattice facing toward an active layer is selected as the zero point for the vertical position z within the superlattice. The active layer is therefore located to the left of the illustrated region of the superlattice, at negative values of the vertical position z. The layer of the superlattice that begins at z=0 and is located closest to the active layer is of type a.

FIG. 2a depicts a superlattice comprising 30 layers each of type a and type b. The layers of type a are GaN layers and the layers of type b are AlGaN layers with a constant Al content of 16%. The thickness of the layers of both layer types varies, but continuously, not abruptly. In so doing, the layer thickness increases from layer to layer of one type by 0.5 nm. The dependence of layer thickness on vertical position z is therefore root-function-shaped.

Due to quantization effects, thin layers have an effectively higher band gap and thus lower optical absorption coefficients. By virtue of the fact that thinner layers are provided in the portion of the superlattice facing the active layer, where a higher radiation intensity typically prevails when the semiconductor layer structure is in operation, absorption losses in the superlattice are reduced. The portion of the superlattice facing away from the active layer is typically adjacent to a contact layer for current input. For example, in FIG. 1 the superlattice 9 is adjacent to the p-contact layer 10. The thicker layers used in this portion have a higher lateral conductivity, which advantageously helps to increase the lateral uniformity of vertical current flow within the semiconductor layer structure.

Generalized, the variation of the layer thickness within a superlattice can be described by an (envelope) function that gives the thickness of a layer as a function of the position of that layer. For this purpose, either a common function can be defined for all layer types a, b, etc., or an individual function can be defined for each layer type. Any arbitrary function curve is theoretically possible, including a nonlinear curve, for example.

The superlattice illustrated in FIG. 2b corresponds in terms of layer thicknesses to the example of FIG. 2a. In contradistinction to FIG. 2a, the Al content varies within the AlGaN layers by about 5% on the side of the superlattice facing toward the active layer to about 20% on the side facing away from it. Like the layer thickness, the Al content increases from layer to layer by a fixed amount. If the Al content of a layer of type b is also stated as a function of the vertical position z of the layer, therefore, a root-function-shaped dependence is also obtained for the Al content.

Continuously varying the layer thicknesses enables the properties of the superlattice to be adapted in the best possible manner to spatially different requirements on the superlattice, e.g. with respect to its optical absorption, its lateral or vertical electrical conductivity or its thermal conductivity. Advantageous effects can be further strengthened by combining this variation of layer thickness with variation of the material composition, which can also have an impact on the aforesaid properties.

The description of the invention with reference to the described exemplary embodiments is not to be understood as restricting the invention thereto. Rather, the invention also encompasses combination with all other features recited in the exemplary embodiments and the rest of the description, even if such combination is not the subject matter of a claim.

The invention claimed is:

1. A semiconductor layer structure comprising an active layer and a superlattice composed of stacked layers of a first type and at least one second type, wherein
    said layers of said first type and of said at least one second type are III-V compound semiconductors,
    adjacent layers of different types in said superlattice differ in composition with respect to at least one element,
    said layers have predefined layer thicknesses, and
    layer thicknesses of said layers of said first type and said layers of said second type increase from layer to layer with increasing distance from said active layer.

2. The semiconductor layer structure as in claim 1, wherein said superlattice comprises alternately stacked $In_xAl_yGa_{1-x-y}N$ and $In_wAl_zGa_{1-w-z}N$ layers where $0 \leq x,y,w,z \leq 1$ and $x+y \leq 1$ and $w+z \leq 1$.

3. The semiconductor layer structure as in claim 1, wherein said superlattice comprises alternately stacked $In_xAl_yGa_{1-x-y}P$ and $In_wAl_zGa_{1-w-z}P$ layers where $0 \leq x,y,w,z \leq 1$ or alternately stacked $In_xAl_yGa_{1-x-y}As$ and $In_wAl_zGa_{1-w-z}As$ layers where $0 \leq x,y,w,z \leq 1$ and $x+y \leq 1$ and $w+z \leq 1$.

4. The semiconductor layer structure as in claim 1, wherein the individual said layers of said superlattice are each assigned a vertical position within said semiconductor layer structure, and the layer thickness of a said layer is dependent on the vertical position of that layer within said semiconductor layer structure.

5. The semiconductor layer structure as in claim 4, wherein said dependence of the layer thickness of a said layer on said vertical position is defined by a common function for all said layers of said superlattice.

6. The semiconductor layer structure as in claim 4, wherein said dependence of the layer thickness of a said layer on said vertical position is defined by a first function for layers of said first type and by at least one second function for layers of said at least one second type.

7. The semiconductor layer structure as in claim 5, wherein said first and/or said at least one second and/or said common function is a step function or a monotonously rising/falling function or a linear function or a polynomial function or an exponential function or a logarithmic function or a periodic function or a superposition of the aforesaid functions or contains fractions of one of said functions.

8. The semiconductor layer structure as in claim 1, wherein at least the said layers of a same type in said superlattice differ in composition.

9. The semiconductor layer structure as in claim 1, wherein the content of a material component in at least the said layers of a same type increases from layer to layer with increasing distance from said active layer.

10. An optoelectronic component comprising a semiconductor layer structure as in claim 1.

11. The optoelectronic component as in claim 10, which is a light-emitting diode.

12. The optoelectronic component as in claim 10, which is a laser diode.

* * * * *